United States Patent [19]

Urgero

[11] 4,103,134
[45] Jul. 25, 1978

[54] SWITCH ASSEMBLY FOR CONNECTING OPPOSING CIRCUITS ON A PRINTED CIRCUIT BOARD

[76] Inventor: Peter P. Urgero, 542 Hickok, Park Forest South, Ill. 60466

[21] Appl. No.: 730,578

[22] Filed: Oct. 7, 1976

[51] Int. Cl.² ............................................... H01B 3/40
[52] U.S. Cl. ................................. 200/158; 339/95 R; 339/221 M
[58] Field of Search ............... 200/5 R, 61.58 R, 158, 200/159 R, 292; 339/17 C, 91 R, 178, 179, 180, 221 R, 263, 268 R, 268 S, 95 R, 214 R, 217, 221 M; 219/541

[56] References Cited

U.S. PATENT DOCUMENTS

| | | | |
|---|---|---|---|
| 2,145,041 | 1/1939 | Childers | 200/158 |
| 2,801,309 | 7/1957 | Higbie et al. | 200/159 R X |
| 2,854,552 | 9/1958 | Gouverneur | 200/158 |
| 2,874,248 | 2/1959 | Tondat et al. | 200/158 X |
| 2,962,691 | 11/1960 | Mande et al. | 339/214 R |
| 3,093,887 | 6/1963 | Prestige et al. | 339/221 R X |
| 3,103,400 | 9/1963 | Gaither | 339/214 R X |
| 3,320,607 | 5/1967 | Rueger | 339/221 R X |
| 3,384,853 | 5/1968 | Rademacher | 200/17 C |
| 3,486,158 | 12/1969 | Soltysik et al. | 339/95 R X |
| 3,504,328 | 3/1970 | Olsson | 339/17 C |
| 3,524,960 | 8/1970 | Lohft | 200/158 |
| 3,601,786 | 8/1971 | Brubaker | 339/95 R X |
| 3,654,583 | 4/1972 | Mancini | 339/17 C |
| 3,721,778 | 3/1973 | Seeger, Jr. et al. | 200/5 R |
| 3,736,394 | 5/1973 | Rumbaugh | 200/158 |
| 4,027,128 | 5/1977 | Walker | 200/158 |

FOREIGN PATENT DOCUMENTS

| | | | |
|---|---|---|---|
| 1,540,251 | 11/1969 | Fed. Rep. of Germany | 339/221 M |
| 267,320 | 9/1929 | Italy | 200/158 |
| 793,871 | 4/1958 | United Kingdom | 339/221 M |

OTHER PUBLICATIONS

Western Electric, *Technical Digest No. 20*, Oct. 1970, pp. 33–34, "Programmable through–hole connection", Glasson et al.

*Primary Examiner*—Gerald P. Tolin

[57] ABSTRACT

A switch assembly for a circuit board which may be inserted in an opening in the board and has a male member having a contact surface on one side thereof and a female member provided with at least one radially outwardly extending contact of spring steel or the like which is distorted towards the male member as the female member passes through the opening and springs outwardly into confronting relation with a power contact on the other side of the circuit board.

7 Claims, 5 Drawing Figures

U.S. Patent     July 25, 1978     4,103,134
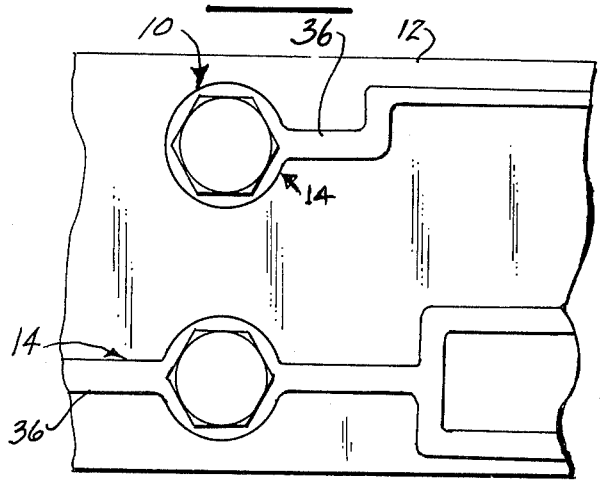
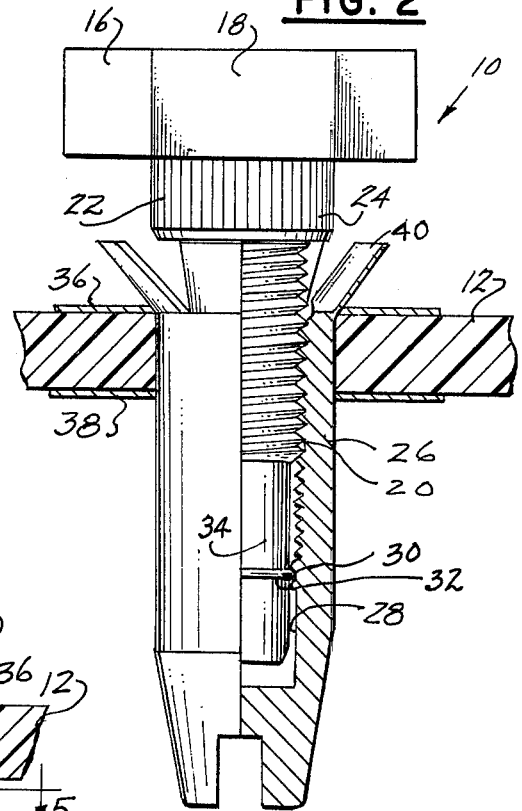
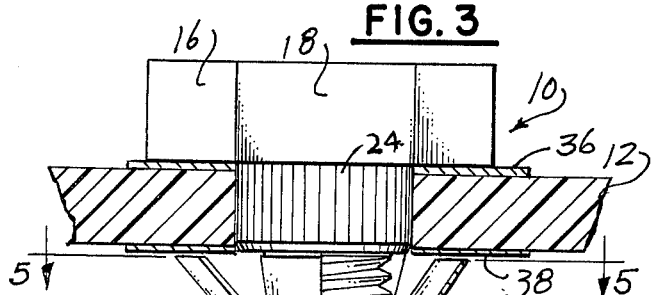
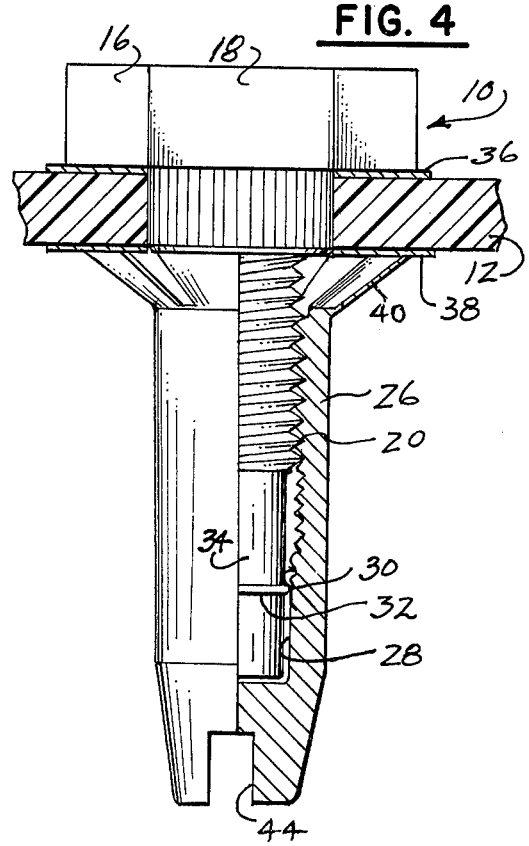
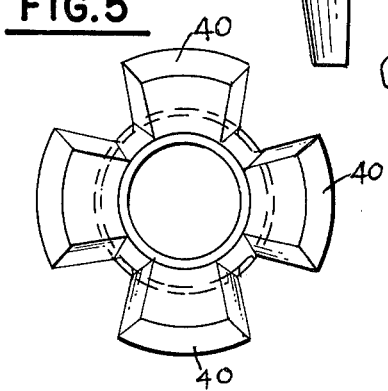

SWITCH ASSEMBLY FOR CONNECTING OPPOSING CIRCUITS ON A PRINTED CIRCUIT BOARD

SUMMARY

A switch assembly for selectively connecting a circuit on one side of a circuit board with a circuit on the other side of a circuit board comprising a switch having a male member having a contact surface in confronting relation to a power lead on one side of the circuit board, the male member being threadedly received in a female member, the switch being insertable as a unit through one side of the circuit board, the female member threadedly receiving the male member and having an outwardly extending spring contact distortable to pass through the circuit board opening and adapted to spring out into confronting relation with a power contact on the other side of the circuit board, means being provided to afford rotation of the female member with respect to the male member to afford electrical contact between the power lead on the first side of the board with the power lead on the other side of the board.

BRIEF DESCRIPTION OF THE DRAWING

FIG. 1 is an elevational fragmentary view of a circuit board embodying the switch assembly of the present invention;

FIG. 2 is a greatly enlarged sectional view of the switch assembly of the present invention illustrated in the condition immediately prior to insertion in the circuit board;

FIG. 3 is a view similar to FIG. 2 but showing the switch assembly in the position it assumes after its insertion in the circuit board;

FIG. 4 is a view similar to FIGS. 2 and 3 but showing the switch assembly with the female member rotated with respect to the male member and the parts in conductive relation; and FIG. 5 is a view taken substantially on line 5—5 of FIG. 3.

DESCRIPTION OF THE PREFERRED EMBODIMENT

Referring now to the drawing and more particularly to FIG. 1, the switch assembly of the invention is shown in operative relation to circuit board 12 having on the surface thereof representative circuits 14 which may be printed, etched or the like.

In FIG. 2 is illustrated the switch assembly 10 in the position it assumes just prior to insertion in an opening in the circuit board 12. The assembly includes a male member 16 having a head 18, which is illustrated as being hexagonal in configuration as provided with threads 20 and a boss 22 having at the outer periphery thereof a milled surface 24 to lock the male member with respect to the circuit board when the entire assembly is forced through the opening in the circuit board so that the parts assume the position illustrated in FIG. 3. The male member is threadedly received in a female member 26 having a threaded bore 28. Formed in the bore 28 just below the threads is a groove 30 in which is received an annular ridge 32 formed with shank 34 of the male member in spaced relation to the free end thereof. The ridge 32 assumes a locking relationship with the groove 30 to prevent inadvertent displacement of the female member from the male member when the assembly is in a position illustrated in FIGS. 2 and 3.

Forming a part of circuit 14 is a power contact 36, illustrated as being annular in form although it may assume other shapes. A similar contact 38 is formed in surrounding relation to the opening in the circuit board on the other side thereof.

Formed integrally with the female member 36 are a plurality of spring contacts 40. As the assembly is moved from the position illustrated in FIG. 1 to the position illustrated in FIG. 2 the spring contacts 40 which normally assume a radially outwardly extending relation are compressed and distorted so that they pass through the opening in the circuit board. After the milled surface 24 is firmly locked into the inner periphery of the circuit board as illustrated in FIG. 3 the contacts 40 spring out to the position illustrated in FIG. 3. In this position the contacts 36 are still not in conductive relation. In order to effect this conductive relation, the female member 26 is provided with a kerf 44 for reception of a conventional screw driver. Upon rotation of the female member the contacts 40 are brought into conductive relation with the contact 38 and thus the circuit on the lower surface of the board is energized through the contact 36, the head 18, the male member 16, the female member 36 and the contacts 40.

As pointed out above the ridge 32 on the shank 34 of the male member is received in the groove 30 in the female member and thus the female member cannot be inadvertently displaced while in the position of FIG. 3. It will be understood that the circuit 14 is merely illustrative as is the circuit board 12. The invention finds particular use in the type of circuit board used in telephony in which a plurality of circuit boards are vertically disposed on tracks which slide into and out of contact with a conductive socket connected to the rest of the telephone circuitry. For example, a typical circuit board would embody 24 circuits on one side with 24 openings. The switch assembly would, at first, assume the relationship of FIG. 3. As additional circuits are needed the circuit board is slided outwardly on its tracks, being de-energized as this occurs and any number of the female members may be tightened to add another circuit to the system.

I claim:

1. Apparatus for connecting an electrical circuit on one side of a dielectric circuit board with a circuit on the opposite side of the circuit board comprising a switch assembly received in an opening in the circuit board and having a threaded electrically conductive male member provided with a flat head, an electrically conductive female member internally threaded for reception of said male member, said female member being provided with at least one radially angularly extending contact, said female member being rotatable with respect to said male member to effect energization of the circuit on said other side of said board.

2. Apparatus in accordance with claim 1 wherein said female member is provided with a plurality of circumferentially spaced spring contacts.

3. Apparatus in accordance with claim 1 wherein locking means are provided to prevent inadvertent disconnection of said male member and said female member.

4. Apparatus in accordance with claim 2 wherein the switch assembly may be inserted in the opening through one side of the circuit board and wherein the head of the male member is urged into conductive relation with a power contact on said one side of said board while the contacts of the female member are out of engagement with their associated power contact of the circuit on said other side of said board.

5. Apparatus in accordance with claim 2 wherein said male member is provided with a milled boss adapted snugly to be received in the circuit board opening to prevent rotation of the male member with respect to the circuit board once the assembly is inserted in the board so that said female member may be advanced toward said board to effect energization of the circuit on the other side of the board without the need for holding said male member.

6. Apparatus in accordance with claim 5 wherein means are provided to effect rotation of said female member.

7. Apparatus in accordance with claim 6 wherein said last-named means comprises a kerf for reception of a screwdriver.

* * * * *